(12) United States Patent
Jou et al.

(10) Patent No.: US 10,436,991 B2
(45) Date of Patent: Oct. 8, 2019

(54) OPTICAL INTERCONNECT MODULES BASED ON GLASS SUBSTRATE WITH POLYMER WAVEGUIDE

(71) Applicant: ADOLITE INC., Santa Clara, CA (US)

(72) Inventors: Abraham Jou, Fremont, CA (US); Paul Mao-Jen Wu, Taipei (TW)

(73) Assignee: ADOLITE INC., Santa Clara, CA (US)

( * ) Notice: Subject to any disclaimer, the term of this patent is extended or adjusted under 35 U.S.C. 154(b) by 0 days.

(21) Appl. No.: 15/963,030

(22) Filed: Apr. 25, 2018

(65) Prior Publication Data

US 2018/0335586 A1 Nov. 22, 2018

Related U.S. Application Data

(60) Provisional application No. 62/509,892, filed on May 23, 2017, provisional application No. 62/508,940, filed on May 19, 2017.

(51) Int. Cl.
*G02B 6/42* (2006.01)
*H04B 10/25* (2013.01)
(Continued)

(52) U.S. Cl.
CPC .......... *G02B 6/428* (2013.01); *H04B 10/25* (2013.01); *G02B 6/12011* (2013.01);
(Continued)

(58) Field of Classification Search
None
See application file for complete search history.

(56) References Cited

U.S. PATENT DOCUMENTS 5,282,080 A    1/1994   Scifres et al.
5,416,861 A    5/1995   Koh et al.
(Continued)

OTHER PUBLICATIONS

Chen et al., "Chip-Level 1 2 Optical Interconnects Using Polymer Vertical Splitter on Silieuri Substrate," IEEE Photonlcs Journal, 6:1-9, (2014).[Retrieved from the Internet on Jun. 29, 2018 <URL:https://ieeexplore.ieee.org/stamp/stamp.jsp?tp=&arnumber=67.
(Continued)

*Primary Examiner* — Jerry Rahll
(74) *Attorney, Agent, or Firm* — Alston & Bird LLP

(57) ABSTRACT

A glass substrate as a platform for a high speed optical interconnect is disclosed. An optical engine is mounted on the top surface and a polymer waveguide on the bottom surface of the glass substrate. A metal plate can be included for mechanical support. The optical engine includes conductive lines patterned into the glass and active optical devices bonded with the conductive lines. An anisotropic conductive film (ACF) connects the optical engine with a printed circuit board. The waveguide, attached parallel to the bottom surface of the glass substrate, includes a core structure, a 45 degree tapered portion at one end of the core structure, used as a light reflector. An optical fiber connector is attached to the far end of the polymer waveguide. The optical path is formed from the active optical device on the top surface, through the glass substrate and the polymer waveguide, to the optical fiber connector on the bottom surface of the glass substrate.

17 Claims, 9 Drawing Sheets

(51) Int. Cl.

| | | |
|---|---|---|
| G02B 6/12 | (2006.01) | |
| H04B 10/50 | (2013.01) | |
| H04B 10/67 | (2013.01) | |
| H04J 14/02 | (2006.01) | |
| H05K 1/02 | (2006.01) | |
| H05K 1/18 | (2006.01) | |
| H01S 5/022 | (2006.01) | |
| H01S 5/183 | (2006.01) | |

(52) U.S. Cl.
CPC ....... *H01S 5/02284* (2013.01); *H01S 5/02292* (2013.01); *H01S 5/183* (2013.01); *H04B 10/506* (2013.01); *H04B 10/67* (2013.01); *H04J 14/02* (2013.01); *H05K 1/0274* (2013.01); *H05K 1/189* (2013.01); *H05K 2201/10121* (2013.01); *H05K 2201/10151* (2013.01)

(56) References Cited

U.S. PATENT DOCUMENTS

| | | |
|---|---|---|
| 5,485,021 A | 1/1996 | Abe |
| 6,036,956 A | 3/2000 | Jacob et al. |
| 6,049,639 A | 4/2000 | Paniccia et al. |
| 6,052,498 A | 4/2000 | Paniccia |
| 6,243,508 B1 | 6/2001 | Jewell et al. |
| 6,393,169 B1 | 5/2002 | Paniccia et al. |
| 6,403,393 B1 | 6/2002 | Adkisson et al. |
| 6,456,765 B1 | 9/2002 | Klocek et al. |
| 6,549,708 B2 | 4/2003 | Worchesky et al. |
| 6,587,605 B2 | 7/2003 | Paniccia et al. |
| 6,731,856 B1 | 5/2004 | Fujita et al. |
| 6,845,184 B1 | 1/2005 | Yoshimura et al. |
| 7,218,809 B2 | 5/2007 | Zhou et al. |
| 7,266,262 B2 | 9/2007 | Ogawa |
| 7,627,204 B1 | 12/2009 | Deane |
| 9,036,956 B2 | 5/2015 | Tseng et al. |
| 9,086,551 B2 | 6/2015 | Heroux |
| 9,341,797 B2 | 5/2016 | Nakagawa et al. |
| 2001/0031109 A1 | 10/2001 | Paniccia et al. |
| 2001/0038737 A1 | 11/2001 | Imada et al. |
| 2002/0018507 A1 | 2/2002 | Deacon |
| 2002/0036356 A1 | 3/2002 | Teshima |
| 2002/0114587 A1 | 8/2002 | Golwalkar et al. |
| 2003/0015770 A1 | 1/2003 | Talin et al. |
| 2003/0223673 A1 | 12/2003 | Garito et al. |
| 2004/0109654 A1 | 6/2004 | Feger et al. |
| 2004/0264837 A1 | 12/2004 | Ogawa |
| 2005/0031265 A1 | 2/2005 | Simon et al. |
| 2005/0041906 A1 | 2/2005 | Sugama et al. |
| 2005/0063636 A1 | 3/2005 | Joyner |
| 2005/0141808 A1* | 6/2005 | Cheben .............. G02B 6/12019 385/31 |
| 2005/0201707 A1 | 9/2005 | Glebov |
| 2006/0045418 A1 | 3/2006 | Cho et al. |
| 2008/0031583 A1 | 2/2008 | Ohtsu et al. |
| 2008/0037934 A1 | 2/2008 | Daikuhara et al. |
| 2009/0060526 A1 | 3/2009 | Matsui et al. |
| 2009/0072393 A1 | 3/2009 | Bachman |
| 2009/0202713 A1 | 8/2009 | Pitwon |
| 2009/0218519 A1 | 9/2009 | McLeod |
| 2010/0032853 A1 | 2/2010 | Naitou |
| 2010/0104290 A1 | 4/2010 | Nobuhara et al. |
| 2010/0213561 A1 | 8/2010 | Assefa et al. |
| 2010/0215313 A1 | 8/2010 | Matsuoka et al. |
| 2010/0226655 A1 | 9/2010 | Kim |
| 2011/0030778 A1 | 2/2011 | Takacs et al. |
| 2011/0133063 A1 | 6/2011 | Ji et al. |
| 2012/0076454 A1 | 3/2012 | Shiraishi |
| 2012/0177381 A1 | 7/2012 | Dobbelaere |
| 2012/0314990 A1 | 12/2012 | Pitwon et al. |
| 2013/0182998 A1 | 6/2013 | Andry et al. |
| 2013/0223789 A1 | 8/2013 | Lee |
| 2014/0112616 A1 | 4/2014 | Numata |
| 2014/0140657 A1 | 5/2014 | Shiraishi |
| 2014/0294342 A1 | 10/2014 | Offrein |
| 2014/0321804 A1 | 10/2014 | Thacker et al. |
| 2014/0355931 A1 | 12/2014 | Tummala et al. |
| 2015/0117824 A1 | 4/2015 | Wang et al. |
| 2015/0168646 A1 | 6/2015 | Arai |
| 2015/0333831 A1 | 11/2015 | Lai et al. |
| 2015/0362673 A1 | 12/2015 | Zheng et al. |
| 2015/0362676 A1 | 12/2015 | Murison et al. |
| 2016/0156999 A1 | 6/2016 | Liboiron-Ladouceur et al. |
| 2016/0178839 A1 | 6/2016 | Tsujita |
| 2017/0017042 A1 | 1/2017 | Menard et al. |
| 2017/0230117 A1 | 8/2017 | Li et al. |
| 2018/0149815 A1 | 5/2018 | Heroux et al. |

OTHER PUBLICATIONS

Shen et al., "Implementation of Chip-Level Optical Interconnect With Laser and Photodetector Using SOI-Based 3-D Guided-Wave Path", IEEE Photonics Journal, 6:1-9, (2014).
Shen et al., "Chip-Level Optical Interconnects Using Polymer Waveguides Integrated With Laser-PD on Silicon," IEEE Photonics Technology Letters, (27):13, (2015). [Retrieved from the Internet on Mar. 7, 2018 <URL: https://ieeexplore.Ieee.org/abstract/docu.
U.S. Appl. No. 15/963,043, Requirement for Restriction-Election dated Jun. 29, 2018.
U.S. Appl. No. 15/963,440 Requirement for Restriction-Election dated Jul. 10, 2018.
U.S. Appl. No. 15/963,780, Requirement for Restriction-Election dated Jul. 27, 2018.
U.S. Appl. No. 15/964,889, Non-Final Office Action dated Jun. 27, 2018.
WIPO Application No. PCT/US2018/031328, PCT International Search Report and Written Opinion of the International Searching Authority dated Jul. 26, 2018.
WIPO Application No. PCT/US2018/031331, PCT International Search Report and Written Opinion of the International Searching Authority dated Jul. 26, 2018.
WIPO Application No. PCT/US2018/031332, PCT International Search Report and Written Opinion of the International Searching Authority dated Jul. 26, 2018.
WIPO Application No. PCT/US2018/031333, PCT International Search Report and Written Opinion of the International Searching Authority dated Jul. 26, 2018.
WIPO Application No. PCT/US2018/031334, PCT International Search Report and Written Opinion of the International Searching Authority dated Jul. 26, 2018.
WIPO Application No. PCT/US2018/031335, PCT International Search Report and Written Opinion of the International Searching Authority dated Sep. 12, 2018.
WIPO Application No. PCT/US2018/031338, PCT International Search Report and Written Opinion of the International Searching Authority dated Jul. 31, 2018.
WIPO Application No. PCT/US2018/031343, PCT International Search Report and Written Opinion of the International Searching Authority dated Jul. 31, 2018.
WIPO Application No. PCT/US2018/031345, PCT International Search Report and Written Opinion of the International Searching Authority dated Jul. 26, 2018.
U.S. Appl. No. 15/963,665, Notice of Allowance dated Oct. 3, 2018.
U.S. Appl. No. 15/963,780, Non-Final Office Action dated Oct. 24, 2018.
U.S. Appl. No. 15/964,701, Non-Final Office Action dated Oct. 5, 2018.
WIPO Application No. PCT/US2018/031336, PCT International Search Report and Written Opinion of the International Searching Authority dated Sep. 19, 2018.
U.S. Appl. No. 15/963,043, Requirement for Restriction-Election dated Feb. 25, 2019.
U.S. Appl. No. 15/964,889, Notice of Allowance dated Mar. 21, 2019.

* cited by examiner

OPTICAL INTERCONNECT MODULES BASED ON GLASS SUBSTRATE WITH POLYMER WAVEGUIDE

CROSS REFERENCE TO RELATED APPLICATIONS

This application claims the benefit of U.S. Provisional Patent Applications No. 62/508,940, titled "OPTICAL COUPLING STRUCTURE" filed May 19, 2017, and No. 62/509,892, titled "OPTICAL INTERCONNECT MODULES" filed May 23, 2017, which are incorporated by reference herein in their entirety.

FIELD

Embodiments described herein relate to optical interconnect modules, and more particularly optical sub-assembly systems in optical interconnects.

BACKGROUND

Cloud computing, enterprise networks, and data center networks continue to drive increased bandwidth demand of optical waveguides for metro and long haul wires, and also rack-to-rack wires within data centers to 100 Gbps and beyond. Increased bandwidth demand has motivated overall high data transmission speed on entire optical systems.

Optical interconnect techniques continue to gain attention as potential solutions for high-speed data transmission between systems, and over a variety of distances. For example, optical interconnect solutions have been proposed for a number of applications, such as between racks in a data center, between household consumer electronics, and between boards or chips within server systems. Optical interconnects are particularly suitable for adoption within transmitter and receiver systems.

In a conventional optical sub-assembly (OSA) design, a transmitter module includes a transmission laser, a driver integrated circuit (IC), and a printed circuit board (PCB), while a receiver module includes a photodetector (PD), a trans-impedance amplifier (TIA), and a PCB. The optical path between the transmission laser (commonly a vertical cavity surface emitting laser (VCSEL)) and PD is typically an optical fiber, such as a fiber ribbon and optical waveguides. Complex beam routers including a focusing lens, a prism, and a fiber connector are used to precisely align the optical fiber with the optical path. Mechanical structures including screws, clips, alignment pins and structural housing are commonly used to secure and align the beam routers.

However, an optical interconnect typically requires coupling of fiber assembly and lasers which involves an external lens alignment, adding complexity and energy loss. A less complicated assembly technique is needed to improve efficiency and reduce cost.

SUMMARY

The application discloses a PCB-based optical interconnect module with a glass substrate as a platform to connect a VCSEL laser to a fiber cable. A glass substrate with transmission lines and solder bumps on bond pads fabricated on its top side and a polymer waveguide fabricated on its bottom side is designed and developed for an optical interconnect module with high data rates.

In accordance of an embodiment, the optical interconnect apparatus includes a glass interposer having a first surface and a second surface opposite to each other; an optical engine mounted on the first surface, including: a plurality of conductive lines patterned on the first surface of the glass interposer; an active optical device, a driver chip, and a receiver chip bonded with the plurality of conductive lines; a printed circuit board (PCB) having an opening is mounted on the first surface of the glass interposer; an anisotropic conductive film (ACF) connecting the optical engine with the printed circuit board, aligning the optical engine to the first opening of the printed circuit board; a plurality of polymer waveguide attached on the second surface of the glass interposer, each waveguide has a cladding structure, a first core structure which is parallel to the second surface of glass interposer it amounts to, and which has a 45 degree tapered portion used as a light reflector; an optical fiber connector attached to the far end of the polymer waveguide; and an optical fiber cable connects to the optical fiber connector. As a result, the optical path is formed from the active optical device on the first surface of the glass interposer through the glass interposer to the optical fiber connector attached on the second surface of the glass interposer.

Optionally, the polymer waveguide includes a second core structure on the 45 degree tapered portion and is perpendicular to the first core structure.

Optionally optical interconnect apparatus of claim 1, the polymer waveguides are attached to the second surface of the glass interposer by an adhesive film.

Optionally the cladding structure surrounds the first and second core.

Optionally, the active optical device is a vertical cavity surface emission laser (VCSEL), or a vertical cavity surface emission laser array (VCSELs).

Optionally the active optical device is a photodiode (PD) or a photodiode array.

Optionally the glass interposer is made of Pyrex, bk-7 glass, quartz, and fused silica, etc. and has a thickness ranging from 50 microns to 2 mm.

Optionally the first and second core structures are made of a polymer core material and the cladding structure is made of a polymer cladding material. The refractive index of the polymer core material is larger than the refractive index of the polymer cladding material to provide total internal reflection along optical path.

Optionally the cladding structure surrounds the first core structure and the 45 degree tapered portion.

A method of fabricating the optical interconnect apparatus is disclosed in accordance of an embodiment. The method includes the following steps. First, providing a glass substrate having two opposing first and second surfaces, a printed circuit board (PCB) unit having an opening and a polymer waveguide having a 45 degree reflector portion at a first end. Second, patterning a plurality of trenches in the first surface of the glass substrate. filling trenches with metal to form transmission lines; connecting optical devices with the transmission lines; depositing an anisotropic conductive film (ACF) on the first surface of the glass substrate; turning the glass substrate over to work on the second surface of the glass substrate; depositing an adhesive film on the second surface of the glass substrate; attaching the polymer waveguide to the second surface of the glass substrate; aligning the optical devices on the first surface of the glass substrate with the 45 degree reflector portion of the polymer waveguide on the second surface of the glass substrate; and attaching an optical fiber connector on the second surface of the glass substrate, and connecting it to a second end of the polymer waveguide. In some applications, the method provides growing bonding pillars and solder bumps on the transmission lines for flip chip mounting on the PCB unit.

In addition, preparing a polymer waveguide having the 45 degree reflector includes these steps: providing a temporary substrate as a support; depositing a first polymer cladding layer on the temporary substrate; patterning the first polymer cladding layer into a trench on the temporary substrate and a 45 degree side wall by applying multiple exposure patterning techniques, wherein patterning the 45 degree side wall by applying the multiple exposure patterning techniques include exposing different locations of the tapered side wall with a plurality of exposure energy levels, wherein the plurality of exposure energy levels includes keeping light source exposure energy output constant and varying exposure time on the tapered sidewall, or keeping light source exposure energy output constant and varying exposure aperture size; depositing a first core layer on the top cladding layer and filling into the trench and also on top of the 45 degree side wall; planarizing the first core layer to remove excess first core layer from the top surface of the first polymer cladding layer; depositing a second cladding layer; patterning the second cladding layer to form a vertical cavity aligned with the tapered side wall; depositing a second core layer and filling the vertical cavity; planarizing the second core layer to remove excess of the second core layer from the second cladding layer; and removing the temporary substrate at the end.

Optionally the method includes removing excess metal after depositing metal into trenches by polishing (CMP) or by selective etch to clean up metal debris outside the trenches.

BRIEF DESCRIPTION OF THE DRAWINGS

Having thus described some embodiments in general terms, reference will now be made to the accompanying drawings, which are not necessarily drawn to scale.

Figure 1:
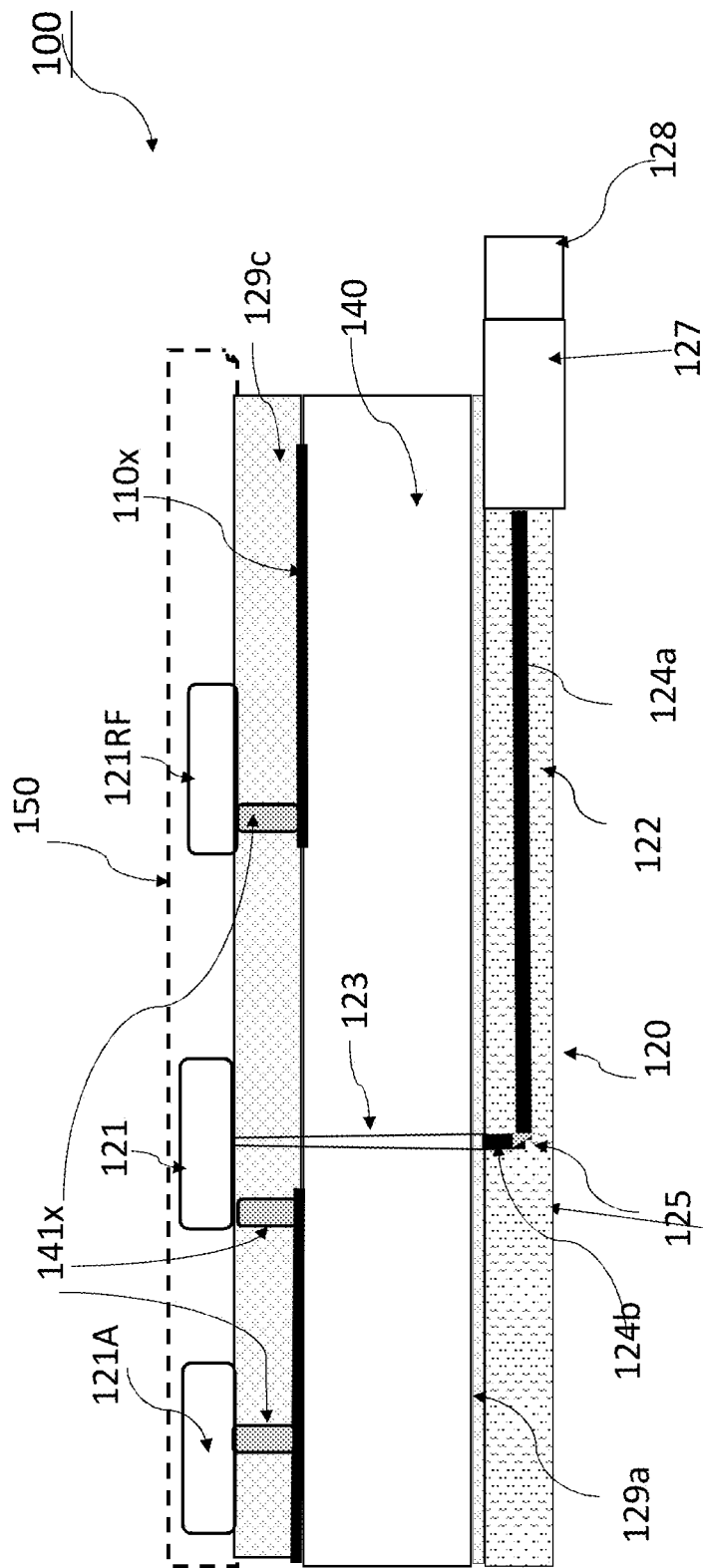

FIG. 1 includes a cross-sectional side view illustrations of a printed circuit (PCB)-based optical interconnect with a glass substrate with a polymer waveguide in accordance with an embodiment.

Figure 2:
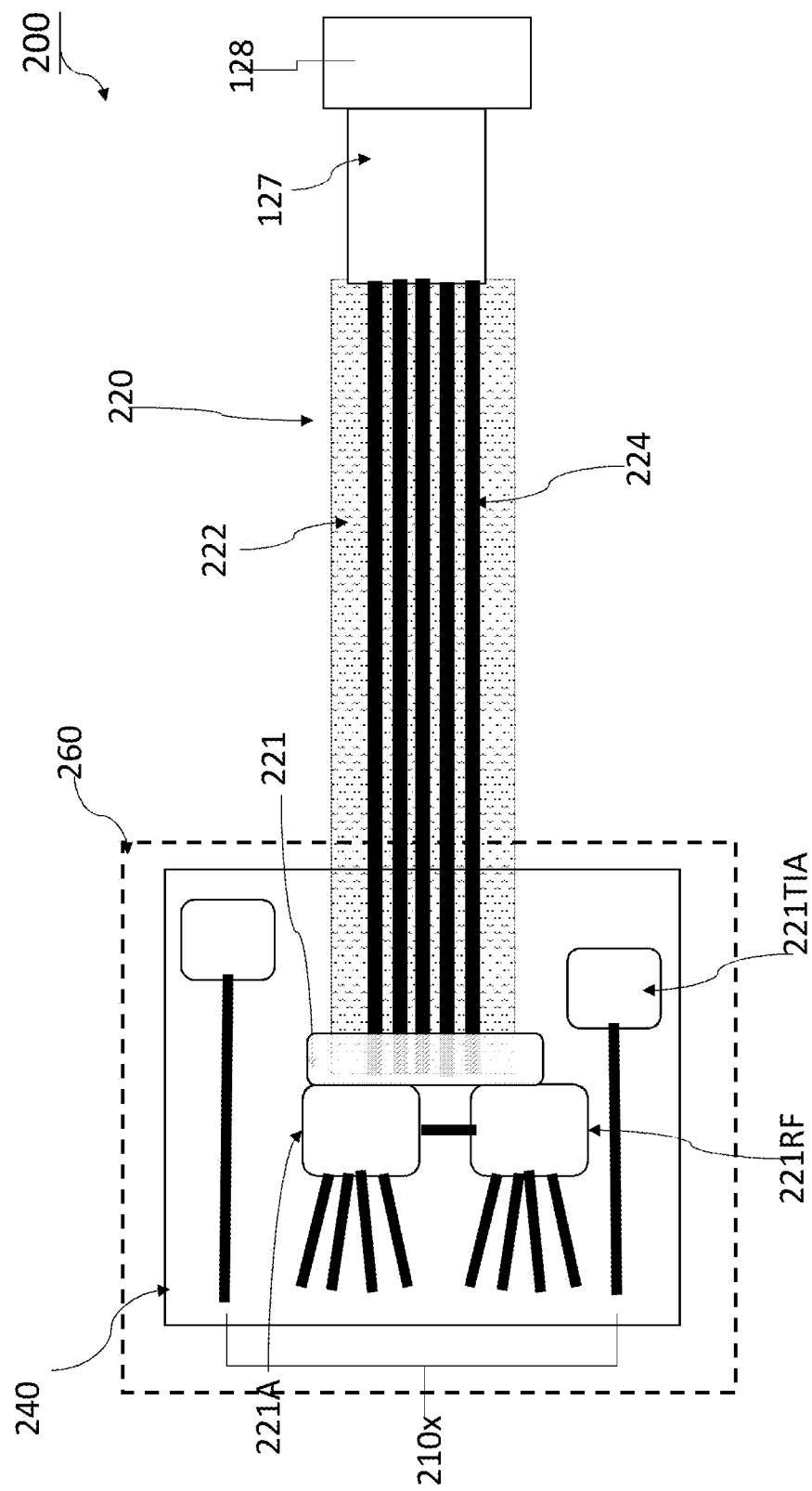

FIG. 2 is a top view illustration of a PCB-based optical interconnect with a glass interposer and a polymer waveguide in accordance with an embodiment.

Figure 3A:
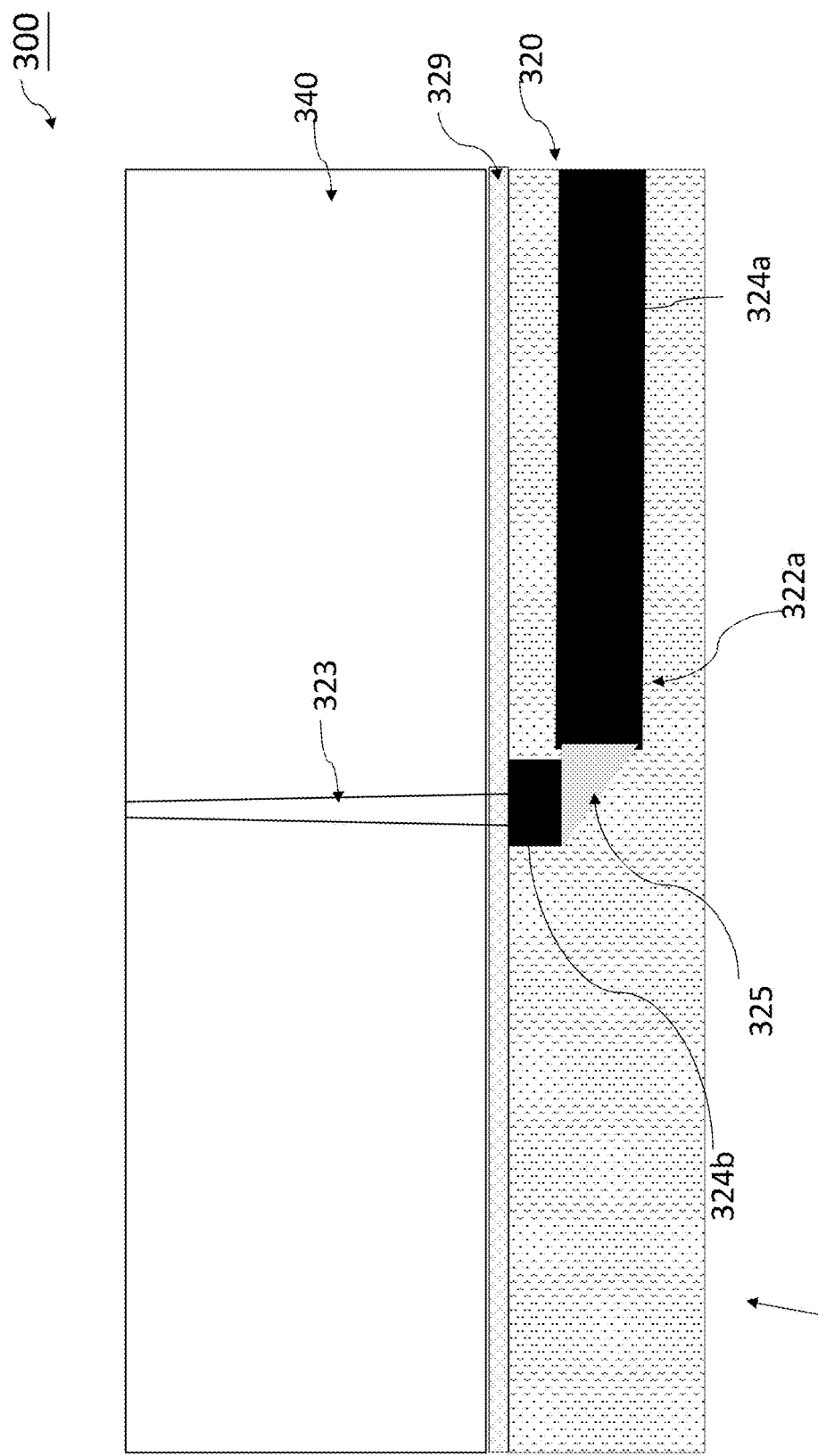

FIG. 3A is a close-up cross-sectional side view showing a waveguide having the vertical portion on one side of the glass substrate in accordance with an embodiment.

Figure 3B:
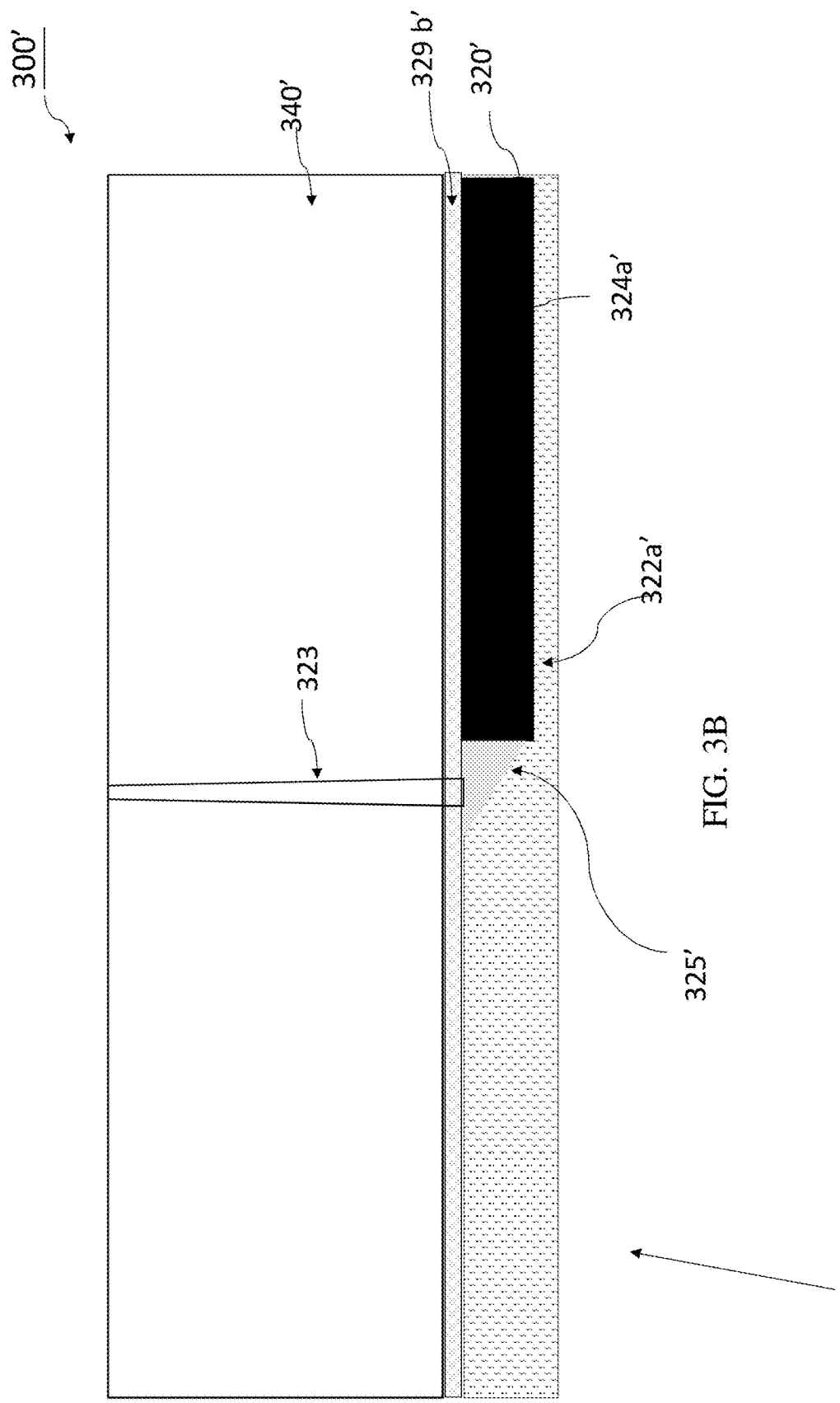

FIG. 3B is a close-up cross-sectional side view showing a waveguide having the 45 degree reflector portion and the core portion in a polymer cladding on one side of the glass substrate in accordance with an embodiment.

Figure 3C:
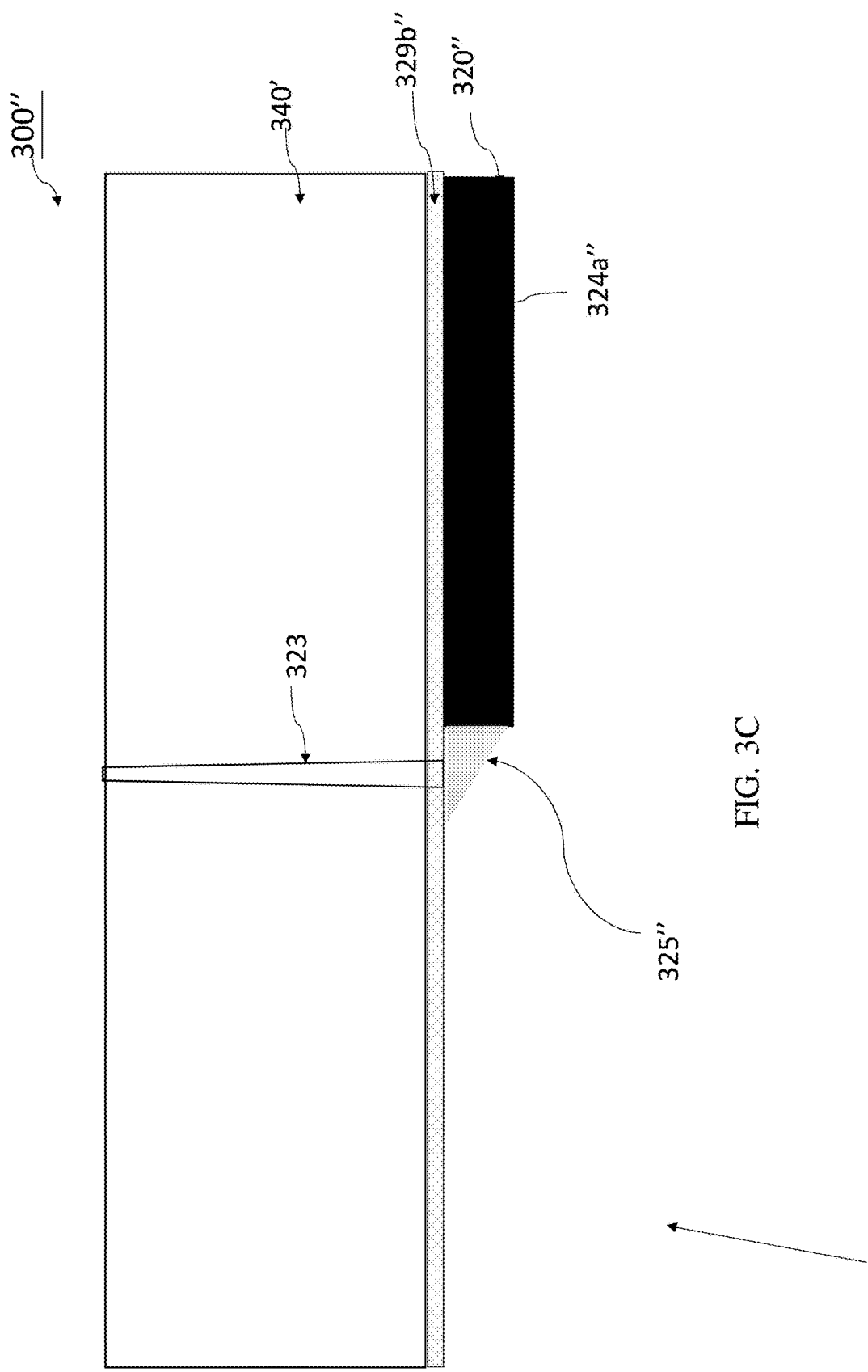

FIG. 3C is a close-up cross-sectional side view showing a clad-less waveguide having the 45 degree reflector portion and the core portion on one side of the glass substrate in accordance with an embodiment.

Figure 4A:
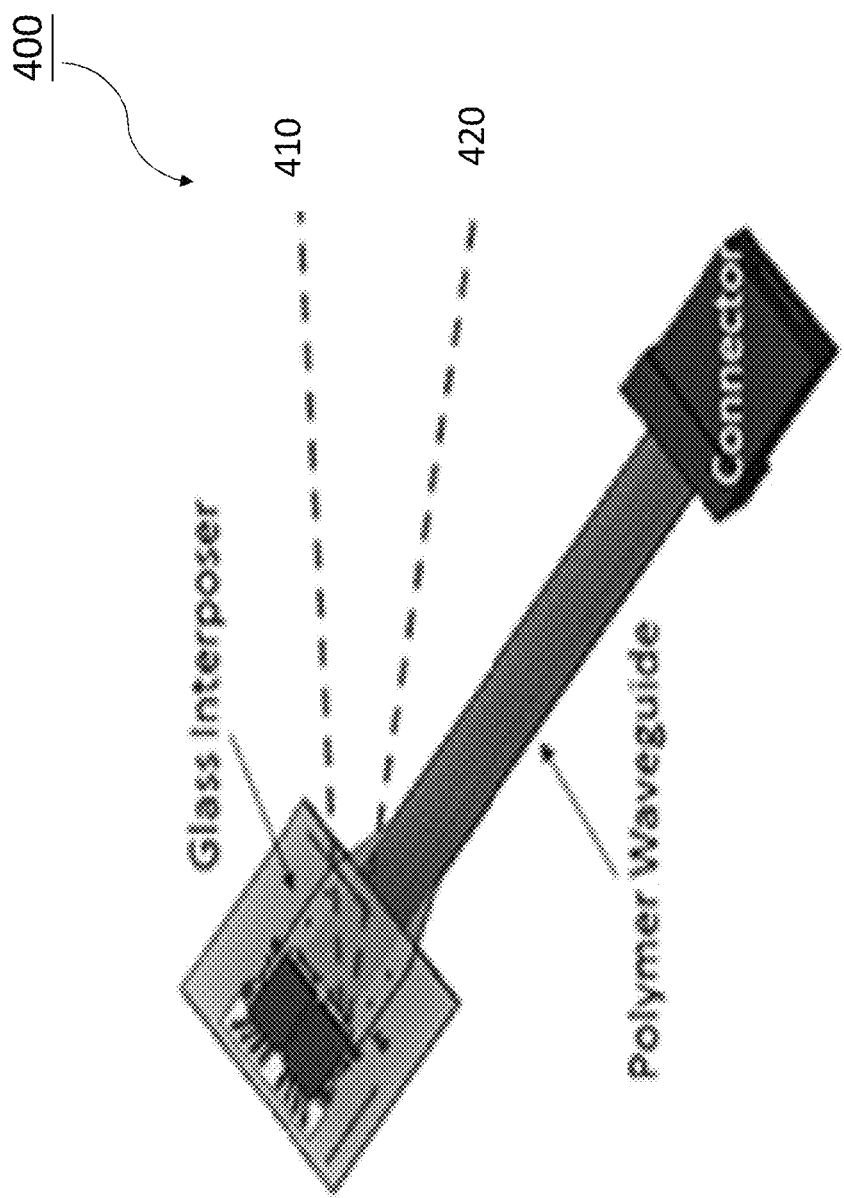

FIG. 4A is isometric view illustration of an exemplary glass substrate based optical interconnect device with a polymer waveguide in accordance with an embodiment.

Figure 4B:
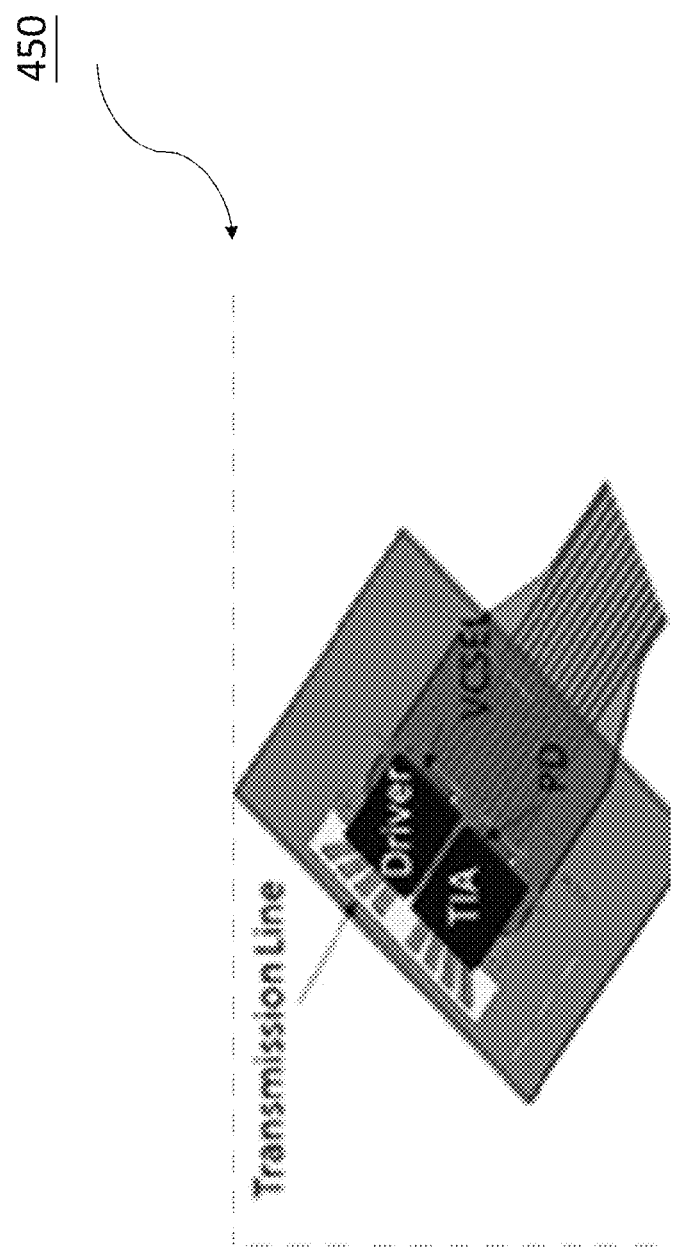

FIG. 4B is a close-up top view illustration of an exemplary glass substrate based optical interconnect device with a polymer waveguide in FIG. 4A in accordance with an embodiment.

Figure 5A:
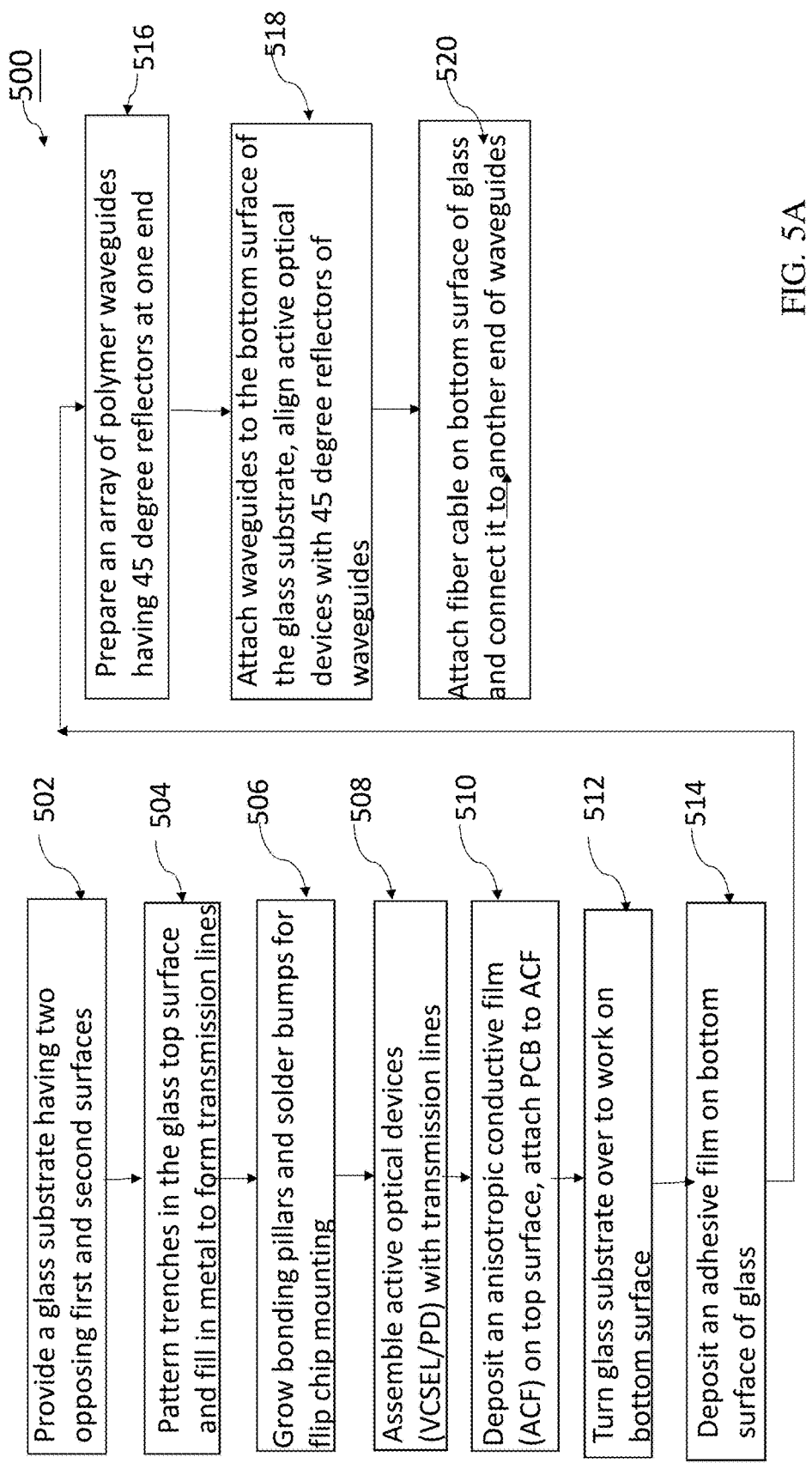

FIG. 5A is a schematic diagram illustrating a fabrication method for making a glass substrate based optical interconnect device with a polymer waveguide in accordance with an embodiment.

Figure 5B:
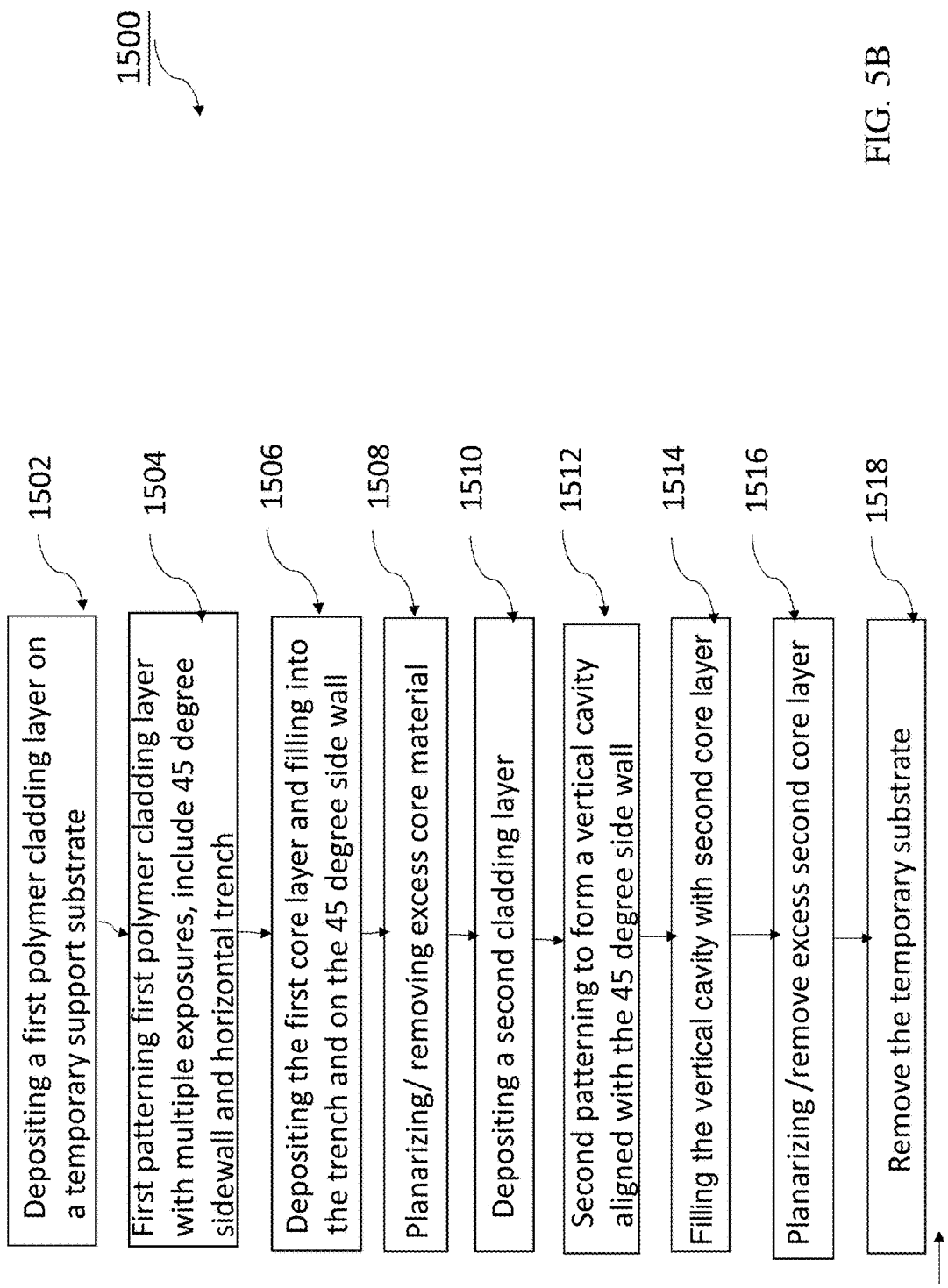

FIG. 5B is a schematic diagram illustrating a fabrication method for making the polymer waveguide with a 45 degree reflector in accordance with an embodiment.

DETAILED DESCRIPTION

The present disclosure is further described below in combination with the drawings and embodiments. It should be understood that, the specific embodiments described herein are merely used to explain the present disclosure rather than limiting the present disclosure. In addition, it should be stated that, in order to facilitate the description, merely a part of structures related to the present disclosure rather than the whole structure are illustrated in the drawings.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

It needs to be noted that, specific details are illustrated in the description below for fully understanding the disclosure. However, the disclosure can be implemented in other ways different from those described herein, and it may be similarly generalized by one skilled in the art without departing from the concept of the disclosure. Therefore, the disclosure will not be limited to the specific embodiments disclosed below.

Optical interconnect is a means of communication by optical fiber cables. Compared to traditional cables, optical fibers are capable of a much higher bandwidth, from 10 Gbit/s up to 100 Gbit/s. Optical communication systems often apply a vertical-cavity surface-emitting laser VCSEL for convenient configurations and easy assembling.

The vertical-cavity surface-emitting laser, or VCSEL is a type of semiconductor laser diode with laser beam emission perpendicular from the top surface, contrary to conventional edge-emitting semiconductor lasers (also in-plane lasers) which emit from surfaces formed by cleaving the individual chip out of a wafer. Vertical cavity self-emitting laser or VCSEL laser emitting light at wavelengths from 650 nm to 1300 nm are typically based on gallium arsenide (GaAs) wafers with diffraction Bragg reflectors (DBRs) formed from GaAs and aluminum gallium arsenide ($Al_xGa_{(1-x)}As$).

There are now two main methods of restricting the current in a VCSEL characterized by two types of VCSELs: ion-implanted VCSELs and Oxide VCSELs. An additional adhesive layer, such as a non-conductive film (NCF), may also be applied to enhance adhesion of the components to the glass substrate. The high speed electrical traces, including the RF transmission devices 226, are designed on the waveguide surface to connect the driver IC and VCSEL arrays as well as to connect trans-impedance amplifier (TIA) arrays. Typically a VCSEL array has four VCSEL lasers packed in a row.

In accordance with an embodiment, the data rate of the optical engine can be operated at 25 Giga-bits per second (Gbps) per channel, and can be extended to higher data rates such as 50 Gbps per channel. VCSEL applications include fiber optic communications, precision sensing, computer mice and laser printers.

Embodiments disclosed below describe optical interconnects and application platforms. In one aspect, the optical interconnects and platforms in accordance with embodiments may be assembled without the optical lenses and fiber ribbons commonly utilized in conventional optical interconnect assemblies. In addition, assembly time can be reduced compared to conventional techniques through use of semiconductor process technologies for the formation of transmission lines and flip chip integration of the active devices such as the driver IC chip, laser, PD, and receiver (e.g. TIA) chip. In addition, the fabrication techniques may allow for improved RF performance of the electrical signals and increased data rates of the optical interconnects. The embodiments illustrated below may be integrated as a PCB-based optical interconnect. In particular, the embodiment may be utilized to improve optical coupling with the VCSEL/PD by monolithically integrating a glass interposer with a VCSEL laser within a PCB, and a polymer waveguide.

FIG. 1 includes a cross-sectional side view illustrations of a printed circuit (PCB)-based optical interconnect with a glass substrate having a polymer waveguide in accordance with an embodiment. As shown in FIG. 1, the interconnect system 100 includes a central piece glass plate 140. The glass plate 140 may be a glass wafer or a glass substrate that has high transmission quality at the working wavelength of the optical interconnect device. High transmission quality includes low absorption and low scattering either from the glass plate material or glass surfaces at the working wavelength. The glass plate 140 has two well-polished top and bottom surfaces. The top and bottom surfaces can be parallel or slightly wedged to each other for low optical reflection noise. The thickness of the glass plate 140 is chosen to be thin so only causes low transmission loss optically and yet has enough strength to support elements on both top and bottom surfaces during its fabrication process and its long term operation. Typically the thickness is in the range of 50 microns to 2 millimeters.

The top surface of the glass plate 140 carries active optical devices, such as laser diodes in a transmitter or photodetectors in a receiver, electronic contacts, and transmission lines of the optical interconnect. First, electrical traces 110x (various transmission lines) are patterned on the clean top surface of the glass plate. Please note that in FIG. 1, not all transmission lines are labeled. Copper, aluminum, tungsten, titanium, stainless steel, or alloys are chosen as materials for high speed transmission lines. Metal layer deposition followed by patterning techniques known in the semiconductor industry is applied in some cases. These techniques include, but not limited to, wet/dry etch, metal plating, or laser writing. Other techniques can also be applied such like, for example, first forming trenches into the top surface of the glass substrate; second, depositing a metal layer on the top surface to fill the trenches, followed by a planarization technique like chemical mechanical polishing (CMP) or selective dry/wet etching to remove the excess metal from outside the trench areas. After patterning transmission lines 110x on the top surface of the glass plate, proper bonding pillars 141x are soldered on the transmission lines 110x as bumps for connecting to active devices or other electronic contacts. Again not all bonding bumps are shown as 141x in FIG. 1. The connection from the top side of the glass interposer to external circuits may use a variety of semiconductor packaging techniques. For example, the transmission lines and bond pads can be defined by lithography process.

An adhesive film is deposited on the top surface over the transmission lines 110x to passivate and insulate them from the active devices which would be arranged above. The adhesive film may include polyimide or other organic non-conductive materials. Another way to insulate maybe to apply a non-conductive film (NCF), over the top surface followed by heating to enhance adhesion of the parts. A cleaning process is also applied to expose the bonding pillars 141x for connecting to the active devices.

An optical engine is formed thereby with optoelectronic connections. The optical engine is assembled to external circuits packaged on a PCB using an optoelectronic packaging technique such as the anisotropic conductive film (ACF) 150.

ACF technology is widely used in optoelectronic packaging for higher signal densities and smaller overall packages. In this process, the anisotropic material, for example, a thermosetting resin containing conductive particles, is first deposited on the PCB using a lamination process. The optical engine on the glass interposer is then placed in position over the PCB and the two sides are pressed together to mount the optical engine to the PCB board. In many cases this mounting process is done with no heat or a minimal amount of heat that is just sufficient to cause the anisotropic material to become slightly tacky. In using a thermosetting resin containing conductive particles, the particles are trapped between the PCB and the optoelectronics elements, thereby creating an electrical connection there between. In other locations where it is not terminated with electrodes, particles are insulated by the thermosetting resin. For bonding, the amount of thermal energy required is higher due to the need to first flow the adhesive and allow the two sides to come together into electrical contact, and then to cure the adhesive and create a lasting reliable bond. The temperatures, times, and pressure required for these processes must be controlled properly.

The active devices 121, such as a vertical cavity surface emission laser (VCSEL) or VCSEL array (for example a standard 1×4 VCSEL), photodetector (PD), receiver chip or trans-impedance-amplifier (TIA) arrays, and in addition, driver IC 121A, and RF device 121RF, are flip chip assembled to the bonding pillars 141x on the top side of the glass interposer 140 to form the optical engine. The high speed transmission lines 110x, including the RF device 121RF, are therefore designed on the glass plate 140 to connect the driver IC 121A to VCSEL arrays 121 as well as to connect the receiver chip TIA arrays and other electrical lines. In accordance with the embodiments, formation of the electrical traces on the glass interposer may lead to improved RF signals performance from the high dielectric constant of the glass interposer material, typically ranging in 3-10. The data rate of the optical engine can be operated at 25 Giga-bits per second (Gbps) per channel, and can be extended to higher data rates such as 50 Gbps per channel.

FIG. 2 is a top view illustration of a PCB-based optical interconnect with a glass interposer and a polymer waveguide in accordance with an embodiment.

The components on PCB board is better illustrated in area 250 of FIG. 2. Similarly as described above, the top surface of the glass plate 240 carries the active optical devices, electronics, and transmission lines of the optical interconnect. First, electrical traces 210x (transmission lines) are patterned on the clean top surface of the glass plate 240. In FIG. 2, not all transmission lines are labeled. Copper, aluminum, tungsten, titanium, or alloys are chosen as materials for high speed transmission lines. Metal deposition followed by patterning techniques known in the semiconductor industry is applied in some cases. These techniques include, but not limited to, wet/dry etch, metal plating, or laser writing. Other techniques can also be applied such like, first forming trenches into the glass top surface, then depositing a metal layer on top surface to fill the trenches, and in it is often followed by a planarization technique like chemical mechanical polishing (CMP) or selective etch to remove excess metal from outside the trench areas. After the transmission lines 210x are patterned on the top surface of the glass plate, bonding pillars with gold or nickel coating are soldered on the transmission lines 210x as bumps for connecting to active devices. Bond structures are formed on the top side of a glass substrate using a semiconductor packaging technique. For example, the transmission lines and bond pads can be defined by lithography process. An additional insulation layer (not shown in FIG. 2), formed of insulating materials such as oxide, nitride, or other organics like polymers, polyimide, is deposited on the top surface over the transmission lines 210x to passivate and insulate them from the active devices which would be arranged on top. Another way to insulate is to apply a non-conductive film (NCF), over the top surface followed by heating to enhance adhesion of the components. A cleaning process is also applied to expose the bonding pillar tops for connecting to the active devices. Not shown here, an anisotropic conductive film (ACF) is used to attach the optoelectronic devices on the PCB unit with the top glass, making interconnections between active devices and transmission lines on the glass with PCB electronics.

The active devices, such as a vertical cavity surface emission laser (VCSEL) or a VCSEL array (for example a standard 1×4 VCSEL), photodetector (PD), driver IC 221A, and receiver chip or trans-impedance-amplifier (TIA) arrays 221TIA, and RF device 221RF, are flip chip assembled to the bonding pillars on the top side of the glass plate 240 to form the optical engine. The high speed transmission lines 210x, including the RF device 221RF, are therefore designed on the glass plate 240 to connect the driver IC 221A and VCSEL arrays 221 as well as to connect the receiver chip TIA or arrays 221TIA and other electrical contacts. In FIG. 2, the optical engine is assembled with a flexible printed circuit board (PCB). In an embodiment, the optical engine is assembled within a periphery of an opening 260 in the PCB. While not separately illustrated, such a configuration is compatible with other embodiments, including that described with regard to FIG. 2.

The optical path is formed from the VCSEL laser 121 via the glass plate 140, the adhesives, and the polymer waveguide 120 at the exit end to fiber cable 128. The glass plate 140 thus turns into a glass interposer.

The polymer waveguide 120 may be formed separately and attached to the bottom surface of glass interposer 140, using an adhesive layer 129a, the adhesive layer may be made of a non-conductive film (NCF).

In accordance with embodiments, VCSEL laser output maybe coupled into a number of channels in a multi-channel polymer waveguides for optical communication. Light is reflected by 45 degree reflector 125 from the vertical portion 124b of the multi-channel polymer waveguides 120 into the horizontal portion 124a. Optical path is designed to transmit optical signals from the lasers VCSELs 121 to fiber arrays 128, as well as to receive optical signals from fiber arrays 128 to photodetectors PD arrays 121 in a receiving mode. The 90 degree light path bent may simplify the optical configuration of the module without fiber assembly at the entrance end.

FIGS. 1 and 2 illustrate a mechanical transport (MT) connector 127 to the fiber arrays 128. In a specific embodiment, the multi-channel polymer waveguides 220 are terminated with a multi-channel mechanical transfer connector 127, also referred to as a PMT connector when connected with a polymer waveguide, to link with a fiber ribbon cable 128. The multi-channel polymer waveguide 120 has a tapered edge on the core layer shown as a 45 degree reflector 125. The optical waveguide 120 may include cladding layer 122 and a horizontal core layer 124a and a vertical core layer 124b both surrounded by the cladding layer 122.

In an embodiment, the polymer waveguides 120 is bonded to the glass interposer 140 with an adhesive film and the adhesive film may be part of a support substrate during the waveguide fabrication process. The waveguides is separated from the part of the support adhesive film before it is attached to the glass interposer 140.

FIG. 3A is a close-up cross-sectional side view showing a waveguide having a vertical portion on one side of the glass substrate in accordance with an embodiment.

In FIG. 3A, the waveguide has a vertical portion 324b and a horizontal portion 324a connected by a 45 degree section 325 which serves like a bending mirror. Laser light travels from the vertical portion 324b to the horizontal portion 324a in the polymer waveguide core through total internal reflection, the 45 degree reflector 325 changes light propagation direction by 90 degrees but does not change the nature of the total internal reflection. The polymer waveguides 320 may be made separately and are bonded to the bottom surface of glass interposer 340 with an adhesive film 329. The adhesive film 329 may be part of a support structure during the waveguide fabrication process. After the waveguides are separated from base support substrate, the adhesive film carries the waveguides until they are attached to the glass interposer 340.

The glass substrate may be attached to a metal plate to increase the mechanical strength of the substrate. The metal can be stainless steel or another compatible metal. Optical path should be allowed to pass openings in the metal plate.

In accordance with another embodiment, the waveguide cladding is removed from the waveguide top portion so the top surface of the polymer waveguide core may be in direct contact with the glass interposer, and as shown in FIG. 3B. In this embodiment, the polymer waveguide 320' includes a horizontal core layer 324a' and a 45 degree reflector portion 325', a horizontal cladding layer 322a' on all sides except the surface contacting the glass interposer bottom surface. The waveguide 320' surface in contact with the glass interposer does not have a cladding layer outside the core layer and the glass interposer 340'. The adhesion film 329 can be a material having the appropriate dielectric constant to keep light propagate inside the core with total internal reflection mode. Optionally if the adhesive film 329b' is thin compared with the system's working wavelength, i.e. if its thickness is only a fraction of the wavelength, then the optical effect of the film may be negligible. To keep light propagate in total internal reflection mode in this case, the glass interposer 340' has a dielectric constant c smaller than that of the polymer waveguide core. An exemplary material is a glass ($\varepsilon<4$) and a polymer ($\varepsilon>4$). The optical path forms from the VCSEL laser, through the glass interposer, to the 45 degree reflector, and then the horizontal waveguide core, before it reaches the optical fiber cable.

FIG. 3C is a close-up cross-sectional side view showing another interconnect module having a clad-less waveguide attached to the glass interposer in accordance with an embodiment.

In this embodiment shown in FIG. 3C, the polymer waveguide 320" includes a horizontal core portion 324a" and a 45 degree reflector portion 325", but there is no cladding layer on any sides of the waveguide. The waveguide 320" top surface is just a film away from the glass interposer 340'. The thin adhesion film 329b" can be a material having an appropriate dielectric constant to keep light propagate inside the core in total internal reflection mode. Optionally, if the adhesive film 329b" is thin compared with the system's working wavelength, i.e. if its thickness is only a fraction of the working wavelength, then the optical effect of the film may be negligible. To keep light propagate in total internal reflection mode in this case, the glass interposer 340' has a dielectric constant $\varepsilon$, smaller than that of the polymer waveguide core. A pair of exemplary materials are glass ($\varepsilon<4$) and polymer ($\varepsilon>4$). As a result, the optical path of the interconnect module consists the VCSEL laser, through the glass interposer, to the 45 degree reflector, and the horizontal waveguide core, before light reaches the optical fiber cable.

FIG. 4A is an isometric view illustration of an exemplary PCB-based optical interconnect device 400 with a glass interposer and polymer waveguide in accordance with an embodiment. The glass interposer forms the mechanical support structure for a PCB board 410, polymer waveguide or waveguides in a multi-channel system, and a connector to an optical fiber cable. Without the glass interposer, a film based PCB maybe too fragile to support the electronic devices and waveguides.

FIG. 4B is a close-up top view of an exemplary PCB-based optical interconnect device 450 with a glass interposer, similar to interconnect system 400 in FIG. 4A. Active optical devices VCSEL/PD, electronic devices TIA, drivers, and RF circuits are attached to transmission lines engraved as metal-in-trench structures on the top surface of the glass interposer, other optoelectronic devices maybe assembled on a PCB unit packaged to the glass interposer top surface. Direct patterning transmission lines on the glass interposer surface guarantees high speed performance.

FIG. 5A is a schematic diagram illustrating a fabrication method for making a PCB-based optical interconnect with a glass interposer in accordance with an embodiment.

The fabrication sequence may include the first step 502: provide a glass substrate having two opposing top and bottom surfaces. The two surfaces may be parallel or slightly wedged to each other to avoid problems caused by ghost reflections. In step 504, pattern (engrave) trenches in the glass top surface and fill in trenches with metal to form transmission lines. This step may be followed with an excess metal removal step by polishing (CMP) or by selective etch to clean up metal left outside the trenches. This removal step is not shown in FIG. 5A. In step 506, grow bonding pillars and solder bumps for flip chip mounting. In step 508, assemble active optical devices (VCSEL/PD) with transmission lines engraved in the top surface of the glass interposer. In the next step 510, deposit an anisotropic conductive film (ACF) on glass top surface, and attach to this ACF film a PCB unit which carries other optoelectronic circuits, so the active optical devices are aligned with circuits on the PCB unit. In step 512, turn the glass interposer over to work on the bottom surface of the glass interposer. Often it is achieved by a designated stage holder on a special equipment. In the next step 514, deposit an adhesive film on the bottom surface of the glass interposer for the waveguide assembly. In step 516, in a separate process, prepare an array of polymer waveguides having 45 degree reflectors at one end of the waveguides. The separate process is described in details later. In step 518, attach the waveguides having 45 degree reflectors to the bottom surface of the glass interposer, aligning the active optical devices (VCSEL/PD) with the 45 degree reflectors of the polymer waveguides. In the next step 520, attach fiber cable on the bottom surface of the glass interposer and connect it to the other end of the polymer waveguides.

FIG. 5B is a schematic diagram illustrating a fabrication method for fabricating a waveguide with a 45 degree reflector in accordance with an embodiment.

The fabrication sequence may include first step 1502, depositing a first polymer cladding layer on a temporary substrate, using a suitable technique such as spin coating or spray coating. In a first patterning process 1504, horizontal trenches along the axis of the polymer waveguide are wet/dry etched into the first polymer cladding layer. In accordance with embodiments, the horizontal trench may include a tapered 45 degree sidewall, such that the trench opening that will be closest to the VCSEL/PD and is larger than the opening that connects with the core trench layer. The 45 degree sidewalls will be used as the 45 degree reflectors. Another way of forming the 45 degree sidewall can be achieved by having multiple lithographic exposures on the sidewall side in a separate step from forming the horizontal trench in the last step. The two exposures apply two masks separately at the horizontal trench area and the 45 degree sidewall area. In the making of the slanted 45 degree sidewalls, multiple exposures with varying mask openings can be applied. In the next step 1506, the polymer core layer is then deposited on the first cladding layer, filling the horizontal trenches and the 45 degree sidewall cavities, followed by step 1508, removing the excess core material outside the core trenches and cavities using a planarization technique such as the chemical mechanical polishing (CMP) or a selective wet/dry etch. In the next step 1510 the second cladding layer is deposited over the planarized surface. A second patterning process 1512 in the second cladding layer is performed to form a vertical cavity aligned with each 45 degree side wall reflector to form an optical path with the horizontal waveguide. The next step 1514, filling the vertical cavity with core material. Another planarization process 1516 is then applied to remove the excess core material outside the vertical cavities and provide a flat and clean surface to be the interface between the vertical waveguide and the active optical device exit plane. Like in the previous removal step 1508, a planarization technique such as the chemical mechanical polishing (CMP) or a selective wet/dry etch can be applied to flatten the surface and remove excess core material. When the waveguides are fabricated, perform step 1518 to disengage the temporary substrate if necessary. The temporary substrate can be a silicon wafer, a glass plate, or another form-factor which provides support during process.

Optionally an additional polishing step is taken to remove the top cladding layer and expose the core of the waveguide and attach the core directly to the glass interposer with the help of an adhesive film, as described in the embodiments of FIG. 3B and FIG. 3C.

However, embodiments are not limited to this particular sequence, and alternative fabrication sequences are envisioned.

In utilizing the various aspects of the embodiments, it would become apparent to one skilled in the art that combinations or variations of the above embodiments are possible for fabricating optical interconnects. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A method of fabricating an optical interconnect apparatus, comprising:
   providing a glass substrate having two substantially parallel first and second surfaces;
   providing a printed circuit board (PCB) unit having an opening;
   preparing a polymer waveguide having a 45 degree reflector portion at a first end;
   patterning a plurality of trenches in the first surface of the glass substrate;
   filling trenches with metal to form conductive lines;
   connecting a plurality of optical devices with the conductive lines;
   depositing an anisotropic conductive film (ACF) on the first surface of the glass substrate to cover the conductive lines and attaching the PCB unit to the ACF;
   turning the glass substrate over to work on the second surface of the glass substrate;
   depositing an adhesive film on the second surface of the glass substrate;
   attaching the polymer waveguide to the second surface of the glass substrate;
   aligning the optical devices on the first surface of the glass substrate with the 45 degree reflector portion of the polymer waveguide on the second surface of the glass substrate;
   attaching an optical fiber connector on the second surface of the glass substrate; and
   connecting the optical fiber connector to a second end of the polymer waveguide;
   wherein preparing a polymer waveguide having a 45 degree reflector portion at a first end comprises:
   providing a temporary substrate as a support;
   depositing a first polymer cladding layer on the temporary substrate;
   patterning the first polymer cladding layer and a 45 degree side wall into a trench on the temporary substrate by applying multiple exposure lithography patterning techniques, wherein patterning the 45 degree side wall by applying the multiple exposure lithography patterning techniques includes exposing different locations of the tapered side wall with a plurality of exposure energy levels, wherein the plurality of exposure energy levels includes keeping light source exposure energy output constant and varying exposure time on the tapered sidewall, or keeping light source exposure energy output constant and varying exposure aperture size;
   depositing a first core layer on the top cladding layer and filling into the trench and also on top of the 45 degree side wall;
   planarizing the first core layer to remove excess first core layer from the top surface of the first polymer cladding layer;
   depositing a second cladding layer;
   patterning the second cladding layer to form a vertical cavity aligned with the tapered side wall;
   depositing a second core layer and filling the vertical cavity;
   planarizing the second core layer to remove excess of the second core layer from the second cladding layer; and
   removing the temporary substrate.

2. The method of fabricating an optical interconnect apparatus in claim 1, further comprising removing excess metal after depositing metal into trenches by polishing (CMP) or by selective etch to clean up metal outside the trenches.

3. The method of fabricating an optical interconnect apparatus in claim 1, further comprising growing bonding pillars, solder bumps with gold or nickel coating on the conductive lines for flip chip mounting on the PCB unit.

4. An optical interconnect apparatus, comprising:
   a glass interposer having a first surface and a second surface substantially parallel to each other;
   an optical engine mounted on the first surface, comprising:
   a plurality of conductive lines patterned on the first surface of the glass interposer;
   an active optical device, a driver chip, and a receiver chip bonded with the plurality of conductive lines;
   a printed circuit board including a first opening mounted over the optical engine;
   an anisotropic conductive film disposed on the first surface covering the plurality of conductive lines, wherein the anisotropic conductive film assembles the optical engine to the printed circuit board, wherein the optical engine is aligned to the first opening of the printed circuit board;
   a plurality of polymer waveguides attached on the second surface of the glass interposer, wherein the plurality of polymer waveguides each comprises: a first core structure bonded to the second surface of the glass interposer, a 45 degree tapered portion at one end of the first core structure used as a light reflector, and a cladding structure surrounding the first core structure including the 45 degree tapered portion end, wherein the plurality of the polymer waveguides each further comprises a second core structure above the 45 degree tapered portion, and wherein the second core structure is perpendicular to the first core structure, and wherein the cladding structure surrounds the second core structure;
   an optical fiber connector attached to other ends of the first core structures; and
   an optical fiber cable connecting to the optical fiber connector;
   wherein an optical path is formed from the active optical device on the first surface of the glass interposer through the glass interposer to the optical fiber connector on the second surface of the glass interposer.

5. The optical interconnect apparatus of claim 4, wherein the active optical device is a vertical cavity surface emission laser (VCSEL), or a vertical cavity surface emission laser array (VCSELs).

6. The optical interconnect apparatus of claim 5, wherein the vertical cavity surface emission laser array (VCSELs) is a 1×4 array and the optical fiber cable has 4 channels.

7. The optical interconnect apparatus of claim 4, wherein the glass interposer is made of Pyrex, bk-7 glass, quartz, and fused silica.

8. The optical interconnect apparatus of claim 4, wherein the glass interposer has a thickness ranging from 50 microns to 2 mm.

9. The optical interconnect apparatus of claim 4, wherein the first and second core structures are made of a polymer core material and the cladding structure is made of a polymer cladding material, wherein the polymer core material has a refractive index larger than a refractive index of the polymer cladding material to provide total internal reflection along optical path.

10. The optical interconnect apparatus of claim 4, wherein the approximately parallel first and second surfaces of the glass interposer are wedged with an angle smaller than 10 degrees.

11. The optical interconnect apparatus of claim 4, wherein the active optical device is a photodiode (PD) or a photodiode array (PDs).

12. The optical interconnect apparatus of claim 4, wherein the optical fiber connector is a mechanical transport (MT) connector.

13. The optical interconnect apparatus of claim 4, wherein the plurality of polymer waveguides are attached to the second surface of the glass interposer by an adhesive film.

14. The optical interconnect apparatus of claim 13, wherein the adhesive film is a non-conductive-film (NCF).

15. The optical interconnect apparatus of claim 4, wherein the conductive lines comprise tungsten (W), aluminum (Al), copper (Cu), gold (Au), silver (Ag), or an alloy.

16. The optical interconnect apparatus of claim 4, wherein the conductive lines are high speed RF transmission lines capable of operating at 25 Gbps per channel.

17. A method of fabricating an optical interconnect apparatus, comprising:
providing a glass substrate having two substantially parallel first and second surfaces;
providing a printed circuit board (PCB) unit having an opening;
preparing a first polymer waveguide core having a 45 degree reflector portion at a first end, wherein the polymer waveguide core is made of a polymer core material;
depositing a polymer waveguide cladding material around the first polymer waveguide core to form a slab of the polymer waveguide;
polishing a top surface and a bottom surface of the slab, wherein the slab has the first polymer waveguide core in between the polymer waveguide cladding material;
forming a second polymer waveguide core by opening a hole to expose the first polymer waveguide core above the 45 degree reflector and filling into the hole with the polymer core material;
patterning a plurality of trenches in the first surface of the glass substrate;
filling trenches with metal to form conductive lines;
connecting a plurality of optical devices with the conductive lines;
depositing an anisotropic conductive film (ACF) on the first surface of the glass substrate to cover the conductive lines and attaching the PCB unit to the ACF;
turning the glass substrate over to work on the second surface of the glass substrate;
depositing an adhesive film on the second surface of the glass substrate;
attaching the slab of the polymer waveguide to the second surface of the glass substrate;
aligning the optical devices on the first surface of the glass substrate with the 45 degree reflector portion of the polymer waveguide on the second surface of the glass substrate;
attaching an optical fiber connector on the second surface of the glass substrate; and
connecting the optical fiber connector to a second end of the polymer waveguide.

* * * * *